United States Patent [19]

Khan et al.

[11] Patent Number: 4,614,961

[45] Date of Patent: Sep. 30, 1986

[54] TUNABLE CUT-OFF UV DETECTOR BASED ON THE ALUMINUM GALLIUM NITRIDE MATERIAL SYSTEM

[75] Inventors: M. Asif Khan, Burnsville; Richard G. Schulze, Hopkins; Richard A. Skogman, Plymouth, all of Minn.

[73] Assignee: Honeywell Inc., Minneapolis, Minn.

[21] Appl. No.: 658,961

[22] Filed: Oct. 9, 1984

[51] Int. Cl.⁴ ................. H01L 27/14; H01L 31/00
[52] U.S. Cl. .......................... 357/30; 357/15; 357/61
[58] Field of Search ............... 357/30, 15, 61; 340/577, 578, 579

[56] References Cited

U.S. PATENT DOCUMENTS 4,095,331  6/1978  Rutz ................................. 357/61
4,300,149  11/1981 Howard et al. ................. 357/15

OTHER PUBLICATIONS

Khan et al., "Properties of Ion Implantation of AlGaN Epitaxial Single Crystal Films Prepared by Low Pressure Metal Organic Deposition", *Applied Physics Letters*, Sep., 1983, pp. 1–3.

A. R. Annoeva et al., "Photoelectric Effect in Variable-Gap $Ga_{1-x}Al_xP$ Surface-Barrier Structures", Sov. Phys. Semicond. 15 (1), Jan. 1981, pp. 64–66.

A. R. Annoeva et al., "Ultraviolet Photodetector Based on a Variable Gap $Ga_{1-x}Al_xP$ Surface Barrier Structure" Sov. Phys. Semicond. 15 (6), Jun. 1981, pp. 646–647.

D. L. Smith et al., "Growth of AlGaN Films for Electrooptic Device Applns.", Report to ONR N00014-77-C-0942.

*Primary Examiner*—James W. Davie
*Assistant Examiner*—Georgia Y. Epps
*Attorney, Agent, or Firm*—Omund R. Dahle

[57] ABSTRACT

A method of preparing a UV detector of $Al_xGa_{1-x}N$. Metal organic chemical vapor deposition (MOCVD) is utilized to grow AlN and then $Al_xGa_{1-x}N$ on a sapphire substrate. A photodetector structure is fabricated on the AlGaN.

6 Claims, 1 Drawing Figure

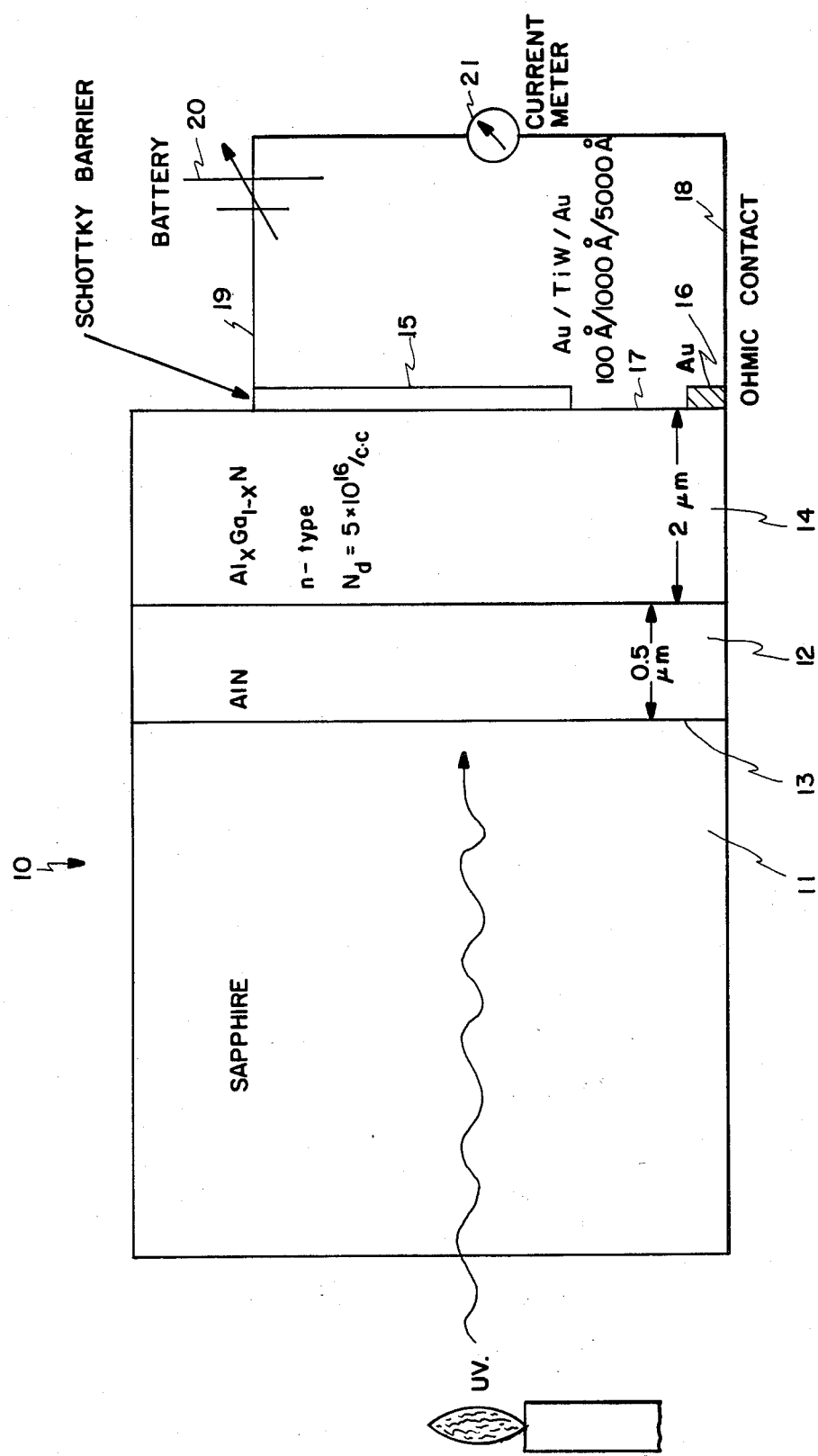

TUNABLE CUT-OFF UV DETECTOR BASED ON THE ALUMINUM GALLIUM NITRIDE MATERIAL SYSTEM

The U.S. Government has certain rights in this invention pursuant to the terms of a contract F33615-82-C-1722.

BACKGROUND AND SUMMARY OF THE INVENTION

This invention is directed to a MOCVD process of fabricating a solid-state UV detector whose long wavelength cut-off can be set between 220 and 360 nm for flame sensing and other applications. The detector is base on the aluminum gallium nitride (AlGaN) material system.

In the prior art it is known to have photocathodes and photomultiplier-tubes (PMT's) which sense ultraviolet (UV) radiation. The PMT's are costly, large size and fragile, and they require high voltage. In addition the long wavelength cut-off of these detectors is not adjustable and they respond to wavelengths longer than 300 nm. Filters can be used to reject wavelengths longer than 300 nm but this adds mass and cost. The solid-state AlGaN detector of this invention is an ideal replacement for the PMT's having low mass, reliability, low cost and has a sharp cutoff wavelength for UV detection.

In the prior art certain UV detectors of $Al_xGa_{1-x}P$ have appeared in the literature. Two of these articles are by the same authors A. R. Annoeva et al, "Photoelectric Effect in Variable-Gap $Ga_{1-x}Al_xP$ Surface-Barrier Structures", Sov. Phys. Semicond. 15(1) January 1981, P64–66 and "Ultra- violet Photodetector Based on a Variable-Gap $Ga_{1-x}Al_xP_x$ ($x_s=0.5+0.1$) Surface-Barrier Structure", Sov. Phys. Semicond. 15(6) June 1981, P646-7. These prior art AlGaP devices were grown by liquid phase epitaxy (LPE). A third article data Feb. 81 is by Donald L. Smith and Richard H. Bruce, entitled "Growth of Aluminum Gallium Nitride Films for Electro-optic Device Applications" and is an unrestricted report to the Office of Naval Research under a Contract No. N00014-77-C-0492. In the prior art an article by Khan et al, "Properties of Ion Implantation of $Al_xGa_{1-x}N$ Epitaxial Single Crystal Films Prepared by Low Pressure Metal Organic Chemical Vapor Deposition", Appl. Physics Letters, September 1983 teaches one method by which $Al_xGa_{1-x}N$ has been grown on a sapphire substrate for use as an optical device in the UV region of the spectrum.

The present invention provides an improved method of growing a AlGaN sensor for ultraviolet which solves a problem of detecting UV radiation against a hot refractory background or solar radiation. Thus this detector can sense UV radiation of a flame in a furnace with a hot refractory background, for example, responding only to the UV and not to radiation of other wavelength emanating from the hot furnace interior. This UV-detector is based on interband absorptions of incoming radiation in the AlGaN material system. The detector does not require any additional filter as the intrinsic absorption cutoff in the semiconductor acts as a filter. The method includes first growing a layer of AlN on the sapphire substrate and then the AlGaN layer upon which a photodetector structure is fabricated.

BRIEF DESCRIPTION OF THE DRAWINGS

The single FIGURE of the drawing is a diagrammatic view of the UV detector made according to the method of the invention.

DESCRIPTION

The present invention describes a solid-state Aluminum Gallium Nitride ($Al_xGa_{1-x}N$) UV detector and the process of fabricating the device. In order to have a sharp wavelength cut-off feature the active laser material should be a single crystal semiconductor in which direct intrinsic bandgap absorption sets in very abruptly. The $Al_xGa_{1-x}N$ system is the preferred choice because it has wide bandgaps which lie in the ultra violet range of energies and because the spectral response can be tuned or tailored to the application by varying the aluminum to gallium ratio. Thus AlGaN has been grown by MOCVD in the compositional range required to produce detectors having peak sensitivities between 3.53 eV(350 nm) and 4.64 eV(267 nm). The MOCVD process is well adapted (unlike halide transport vapor phase epitaxy) to the growth of aluminum-gallium alloy systems because the ratio of aluminum to gallium can be easily controlled.

For the absorbed photons to be detected electrically, the electrons and holes produced must be separated before they recombine. This is conveniently accomplished by drift in an electric field such as that provided by a Schottky barrier or photoconductor approach. The Schottky barrier metal-semiconductor junction results in a depletion region in the AlGaN semiconductor in which the photogenerated electrons and holes are separated by the built-in electric filed which may be augmented if desired by an applied bias. In the forming of this function the doping of the semiconductor is important. If the AlGaN material is too heavily doped n-type ($\sim 10^{18}\ cm^{-3}$), the depletion layer will be very narrow, and tunneling of electrons to the semiconductor through the Schottky barrier will lead to leakage current or to a ohmic contact instead of a good Schottky barrier contact. If the doping is too low, that is if the Fermi level lies greater than several kT below the conduction band, the bulk material will be higly resistive. In the AlGaN system, to form a good Schottky barrier requires a net shallow donor concentration on the order of $10^{16}\ cm^{-3}$.

Referring now to the figure there is shown a solid-state solar blind UV detector 10 having a basal plane sapphire ($Al_2O_3$) substrate 11. In preparing the device the substrate is loaded into a metalorganic chemical vapor deposition (MOCVD) reactor and heated such as by rf induction to 1000° C. Then $NH_3$ and $(CH_3)_3Al$ (trimethylaluminum) or $(C_2H_5)_3Al$ (triethylaluminum) are introduced into the growth chamber and epitaxial growth continues for about 10 minutes resulting in a single crystalline aluminum nitride (AlN) layer 12 about 0.5 μm thick on the surface 13 of the substrate. The buffer layer 12 of AlN results in a higher electron mobility of the epitaxial $Al_xGa_{1-x}N$ layer to be next grown thereon. Then triethylgallium $(C_2H_5)_3Ga$ is also introduced into the growth chamber and the epitaxial growth of the aluminum gallium nitride ($Al_xGa_{1-x}N$) is carried out for about 2 hours. This results in a single crystalline aluminum gallium nitride ($Al_xGa_{1-x}N$) layer 14 on the order of 2 μm thick. The x value selected can be controlled as desired by adjusting the gas flow rates of the several gases. The temperature during $Al_xGa_{1-x}N$ growth is lowered from the 1000° C. and is selected depending upon the x value selected. In one embodiment we grow the active $Al_xGa_{1-x}N$ layer with an x value of about 0.35 which puts the cutoff wavelength at 290 nm. The $Al_xGa_{1-x}N$ layer as grown is n type with $N_d \sim 5 \times 10^{16}$/cc.

A metal Schottky barrier 15 is fabricated on the AlGaN layer. For fabrication of the Schottky barrier 15 and the ohmic contact 16 onto the surface 17 of the $Al_xGa_{1-x}As$ layer 14, the surface 17 is masked to delineate contact 16 and a layer of 3000 Å of gold or other suitable metal is first deposited for contact 16 and is then annealed at 700° C. under flowing $NH_3$ for 5 min. The surface 17 is again masked with photoresist to delineate the Schottky barrier location. Then for barrier 15 there is applied onto surface 17 Au/TiW/Au (100 Å/1000 Å/5000 Å) using for instance an rf-sputtering system. In this particular Schottky metallization, the TiW acts as a diffusion barrier for the 5000 Å layer of gold.

Attached to the device 10 at Schottky barrier 15 and ohmic contact 16 is a series circuit including conductors 18 and 19, dc source such as battery 20 and a current meter 21 for measurement of the resulting photocurrent.

In operation the Schottky barrier is kept under reverse bias (e.g. 2 to 3 V) so that only a leakage current flows in the external circuit. When a photon (UV light from the flame) enters the depletion region under the Schottky barrier through the transparent $Al_2O_3$ substrate (typically 1 mm thick) an electron-hole pair is created. That is, when a UV photon with an energy $E < Eg$ (Eg is the bandgap energy for $Al_xGa_{1-x}N$) is incident on the active layer it creates electron-hole pairs which are swept out by the electric field and hence a signal current is detected in the external circuit. The signal current is only produced when the UV-photon is absorbed in the active layer, and thus the device shows a response which turns on very sharply at a wavelength determined by the bandgap of the active $Al_xGa_{1-x}N$ layer.

While the apparatus has been shown and described as being negatively biased for operation, it can also be operated in a zero-bias photovoltaic mode which makes it fail-safe as no signal is possible except under UV illumination.

The electron-hole pairs and hence the signal current is only produced if the wavelength of incident light is less than or equal to g where $g = hc/Eg$ where "h" is the Planck's constant, "c" the velocity of light and "Eg" is the bandgap of the semiconductor $Al_xGa_{1-x}N$. Another kind of photodetector structure, a photoconductor can also be used. In this both metal contacts 15 and 16 are ohmic contacts and a source of electric field bias is required.

The embodiments of the invention in which an exclusive property or right is claimed are defined as follows:

1. In a solid state UV detector comprising:
    a. a basal plane sapphire ($Al_2O_3$) substrate;
    b. an epitaxial single-crystalline aluminum nitride (AlN) layer grown on the surface of the substrate;
    c. An epitaxial single-crystalline aluminum gallium nitride ($Al_xGa_{1-x}N$) layer grown over said AlN layer; and,
    d. a photodetector fabricated on said $Al_xGa_{1-x}N$ layer surface.
2. The detector according to claim 1 in which the AlN layer is on the order of 0.5 μm thick.
3. The detector according to claim 1 in which the $Al_xGa_{1-x}N$ layer is on the oder of 2 μm thick.
4. The detector according to claim 1 wherein said photodetector is a Schottky barrier.
5. The detector according to claim 4 wherein said Schottky barrier comprises layers of Au, TiW and Au.
6. The detector according to claim 1, wherein said photodetector is of the photoconductor.

* * * * *

UNITED STATES PATENT AND TRADEMARK OFFICE
CERTIFICATE OF CORRECTION

PATENT NO. : 4,614,961

DATED : September 30, 1986

INVENTOR(S) : M. Asif Khan; Richard G. Schulze; Richard A. Skogman

It is certified that error appears in the above-identified patent and that said Letters Patent is hereby corrected as shown below:

In Column 4, line 37, after "photoconductor" insert --type--.

Signed and Sealed this

Seventh Day of May, 1991

Attest:

HARRY F. MANBECK, JR.

Attesting Officer

Commissioner of Patents and Trademarks